(12) United States Patent
Pedrotti et al.

(10) Patent No.: US 6,643,346 B1
(45) Date of Patent: Nov. 4, 2003

(54) FREQUENCY DETECTION CIRCUIT FOR CLOCK RECOVERY

(75) Inventors: Ken D. Pedrotti, Thousand Oaks, CA (US); Alistair J. Price, Columbia, MD (US)

(73) Assignee: Rockwell Scientific Company LLC, Thousand Oaks, CA (US)

( * ) Notice: Subject to any disclaimer, the term of this patent is extended or adjusted under 35 U.S.C. 154(b) by 0 days.

(21) Appl. No.: 09/255,764

(22) Filed: Feb. 23, 1999

(65) Prior Publication Data
(65)

(51) Int. Cl.[7] .............. H03L 7/06; G09G 1/14
(52) U.S. Cl. ............ 375/375; 331/11; 331/10; 331/17; 345/180
(58) Field of Search .............. 375/180, 375, 375/282, 374, 376; 331/11, 10, 2

(56) References Cited

U.S. PATENT DOCUMENTS

| | | | |
|---|---|---|---|
| 4,329,684 A | * 5/1982 | Monteath et al. | 345/180 |
| 4,580,107 A | * 4/1986 | Caldwell et al. | 331/10 |
| 5,446,416 A | * 8/1995 | Lin et al. | 331/11 |
| 5,818,304 A | * 10/1998 | Hogeboom | 331/11 |
| 5,933,058 A | * 8/1999 | Pinto et al. | 331/17 |

OTHER PUBLICATIONS

Buchwald, Aaron Wayne; Design of Integrated Fiber–Optic Receivers Using Heterojunction Bipolar transistors, 1993, pp 278–289, Technical Paper.*

Buchwald, Aaron Wayne; *Design of Integrated Fiber–Optic Receivers Using Heterojunction Bipolar Transistors*, 1993, pp 278–279, Technical Paper.

* cited by examiner

*Primary Examiner*—Stephen Chin
*Assistant Examiner*—Edith Yeh

(57) ABSTRACT

A frequency detector is configured to provide reliable acquisition by a clock recovery and data regeneration circuit. A preferred frequency detector utilizes the output characteristics of a phase detector to determine a frequency difference between the recovered clock signal and the incoming data signal. The frequency detector then outputs a signal representing the frequency difference to a control device, preferably to a voltage-controlled oscillator (VCO). Upon receiving the frequency difference signal, the control device, preferably operating within a controlled-feedback loop, will begin to adjust the underlying clock frequency to approximate the incoming data frequency.

33 Claims, 6 Drawing Sheets

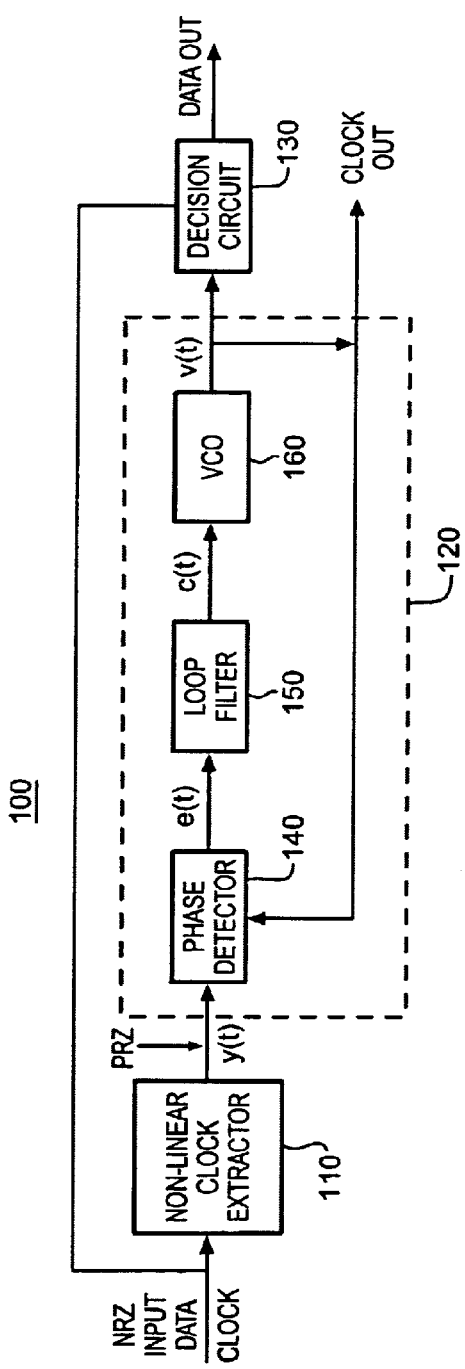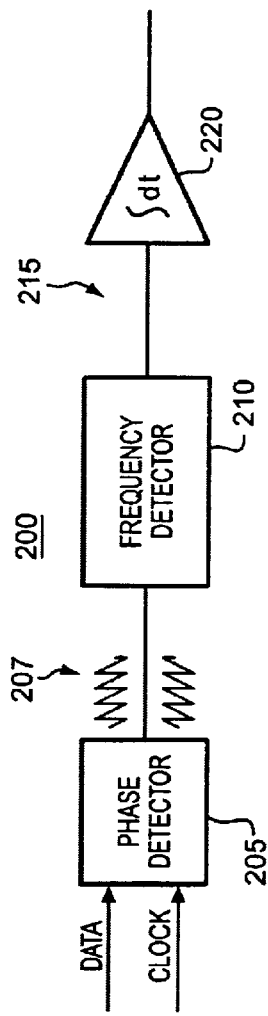

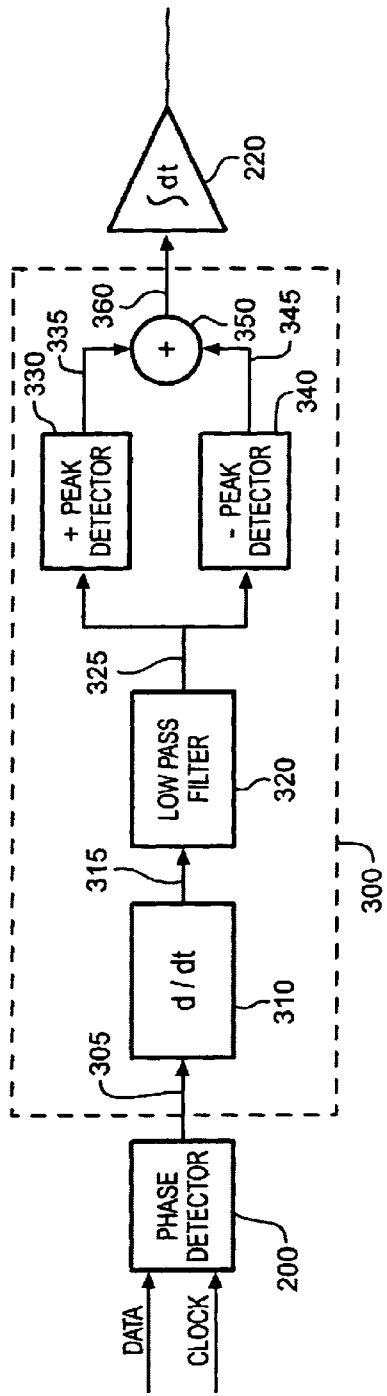
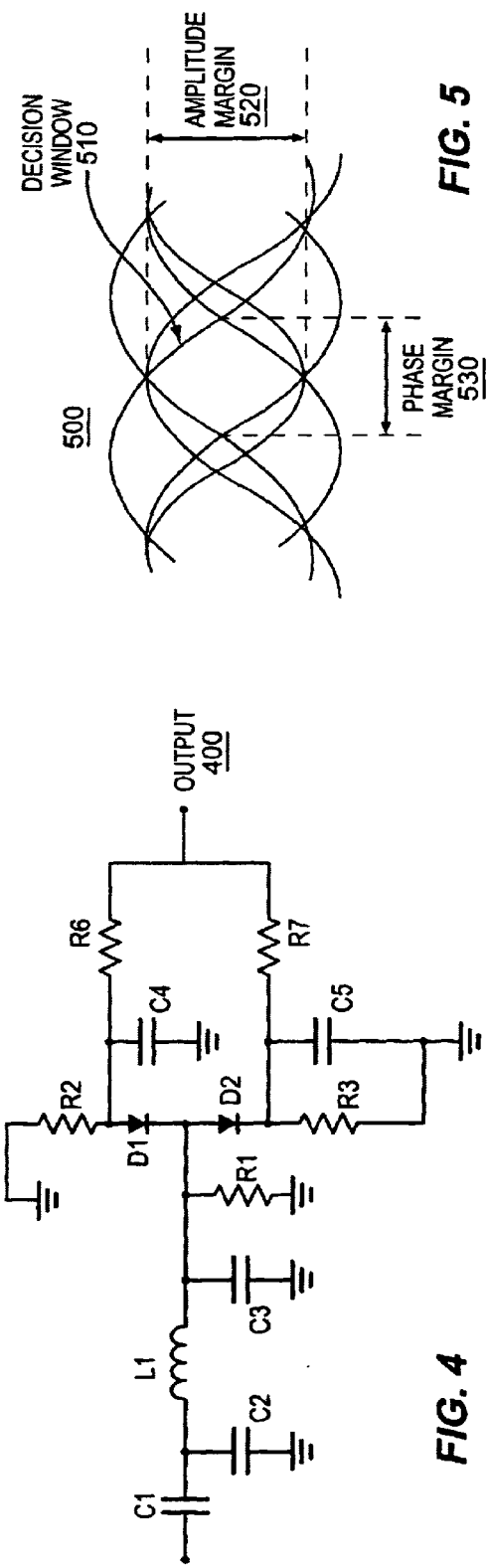

FREQUENCY DETECTION CIRCUIT FOR CLOCK RECOVERY

FIELD OF THE INVENTION

The present invention relates to a frequency detection circuit for use with digital communication systems. More particularly, the present invention relates to a frequency detection circuit that provides a reliable frequency difference signal that may be utilized in extracting an underlying input clock signal. An exemplary application for the present invention is a clock recovery circuit that employs a phase locked loop.

BACKGROUND OF THE INVENTION

Clock signals are routinely utilized during the transmission of digital data. Clock signals associated with the data are required for regenerating and demultiplexing the data stream, i.e., the clock is required to convert the continuous-time received signal into a discrete-time sequence of data symbols. After conversion to a sequence of data symbols, a decision can be made as to whether a given signal is a "1" or a "0". Although many digital systems existing today transmit a clock signal separate from a data stream, for digital communication systems, the transmission of a separate clock is inefficient and cumbersome, since it typically requires several additional components, bandwidth and power.

Accordingly, for digital communication systems, it is more appropriate to extract the clock signal directly from the input data stream rather than to transmit the clock signal separately. However, the underlying recovered clock signal has typically been attenuated and degraded by noise and other imperfections in the modulation and transmission process, and therefore should be reconstructed before further processing. This reconstruction process may include the amplification and filtering of the signal, followed by a sampling of the signal at a time in which there is a low probability of error, i.e., the time of sampling in which a decision can be made as to whether a given digital signal is a "1" or a "0".

In accordance with one high speed digital communication technique, the digital data is transmitted as a series of bits, with each bit occurring within its own time slot. Generally, the occurrence of these time slots is periodic with the underlying clock signal. Two common forms of Pulse Amplitude Modulation (PAM) for the digital signals (Return to Zero (RZ) and Non-Return to Zero (NRZ) modulation) are shown in FIGS. 7A and 7B. With reference to FIG. 7A, RZ modulation is configured such that a "1" is generated by the signal going "high" for a part of the bit period and then returning to the "0" level during the remaining bit period, while a "0" is generated by the signal remaining low during the entire bit period. For NRZ modulation, the signal will typically remain a "1" or a "0" for the entire bit slot. With reference to FIG. 7B, the spectra of both RZ and NRZ signals as modulated by random data are shown. Although the RZ clock signal, unlike the NRZ signal, contains a component at the clock frequency, i.e., a value at 1/T, 2/T and 3/T which can be used for frequency control, the RZ signal utilizes significantly more bandwidth than the NRZ signal. With the emergence of the Synchronous Optical Network (SONET) OC-N standards, it is preferable to extract the clock signal from the input of a NRZ data stream, partly due to the reduced bandwidth requirements of NRZ signals.

Once an input of a NRZ data stream is received, and a regenerated signal having various distortions as described above is produced, the corresponding clock signal is extracted. Two methods are commonly used to extract the clock signal. The first method is to apply a very high-Q filter, such as a Surface Acoustic Wave filter, which typically builds up a component at the clock frequency and then filters out the missing transitions in the conditioned data. However, unless the filtered signal includes substantially the same clock signal as that underlying the input data, phase errors will accumulate. Accordingly, if, for example, the extracted clock signal is as little as 1 hertz different than the underlying clock signal, the decision period for determining whether a "1" or a "0" will be improperly located, and thus the digital communication system will not properly function.

Another method for extraction is to use a phase locked loop (PLL) to lock an oscillator onto the input data stream. With reference to FIG. 1, a clock extraction circuit 100 utilizing a PLL 120 is shown. Reconfigured input data comprising Pseudo-Return-to-Zero data (PRZ), i.e., a modified version of the input data stream; may be received by PLL 120. Further, PRZ data may be produced within a non-linear clock extractor 110 before transmission to PLL 120. However, for some phase detectors, such as, for example, a Hogge phase detector, non-linear clock extractor 110 is not typically used. PLL 120 generally comprises a phase detector 140 suitably connected to a loop filter 150 which in turn is coupled to a voltage-controlled oscillator (VCO) 160. Phase detector 140 is configured to measure the phase error between the input y(t) and the VCO output v(t). The resulting error signal e(t) can be filtered through loop filter 150 to become a control signal c(t) that drives VCO 160. Loop filter 150 is typically configured with a narrow bandwidth that is designed to minimize output phase jitter due to external noise. If the phase of VCO 160 is ahead of the phase of the input signal y(t), the control signal c(t) may be suitably reduced. If on the other hand the phase of VCO 160 gets behind the phase of the input signal y(t), the control signal c(t) may be suitably increased. Accordingly, PLL 120 is designed to drive the error signal e(t) to essentially zero, as dictated by the bandwidth of the loop filter 150, and thus allow VCO 160 to track the phase of the input signal to produce a recovered clock signal.

Once PLL 120 is "locked" onto the clock signal of the input data stream, the clock signal is applied to a decision circuit 130, which also looks at the input data stream, i.e., the NRZ data stream. Decision circuit 130 generally includes a comparator or gain stage and then a sampling stage for sampling the data. Accordingly, decision circuit 130 samples the input data stream and, utilizing the recovered clock signal, correspondingly outputs a "1" or a "0" depending on the value of the incoming data stream during the sampling period. Further, a fixed or manually adjustable relative phase delay is often included to align the clock and data signals when in "lock" at decision circuit 130.

As the input data stream is received, variations and other corruptions within the input data stream are present as described above. To quantify the amount of signal degradation, and to check the performance of clock extraction circuit 100, an eye diagram may be utilized. With reference to FIG. 5, an eye diagram 500 (which may be generated by an oscilloscope) provides many overlaid traces of small sections of the input data stream and visually summarizes the variations and corruptions of the input data stream. Within eye diagram 500, a decision window 510 is formed which provides the optimum time for sampling the input data signal. Other characteristics include an amplitude margin 520 and a phase margin 530. Amplitude margin 520, i.e., the vertical eye opening, generally indicates the immunity to noise for the decision circuit while phase margin 530, i.e., the horizontal eye opening, generally indicates the immunity to errors in the timing phase. Although, the beneficial effect on increasing the loop bandwidth is to increase the horizontal eye opening, and thus the immunity to phase errors, the increased bandwidth can introduce more noise into the decision circuit. Thus, in designing digital communication systems, there is a basic system tradeoff between excess bandwidth, noise immunity and the complexity of the timing recovery circuit.

Due to the narrow bandwidth typically required, a problem encountered by the use of PLL 120 for clock recovery is the limited lock acquisition range. For example, if an input data stream is designed to provide a 10 GHz signal, a filter-based recovery circuit as described above will provide a loop with a 10 MHz bandwidth, i.e., generally $\frac{1}{1000}$ of the input frequency. Accordingly, this loop bandwidth limits the lock acquisition range of PLL 120. Further, when the frequency of the output signal of phase detector 140 exceeds the bandwidth of loop filter 150, no output response, i.e., no control signal c(t), will be provided by loop filter 150 to VCO 160. Additionally, this problem is further increased by the limited stability and accuracy of VCO 160 which has a tendency to further limit the operation of PLL 120. Thus, PLL 120 will typically only respond to signals that are within a very narrow bandwidth in which VCO 160 is operating.

Therefore, it generally becomes necessary for an acquisition aid to be implemented to maintain the free-running frequency where VCO 160 is operating to within one loop bandwidth of the input data rate. These acquisition aids may comprise frequency detectors which provide a voltage output that is proportional to the difference in the frequency of the input clock signal and the local oscillator frequency, i.e:, the frequency of VCO 160. As such, many designers augment phase detector 140 with a frequency detector to provide a phase/frequency locked loop that attempts to drive VCO 160 to the same frequency as the incoming data stream. Unfortunately, however, a clock extraction circuit having a frequency locked loop does not provide the phase alignment needed to align and track the input clock signal. Further, since NRZ data streams do not provide components at the clock frequency, i.e., no spectral density at the clock frequency, the use of the NRZ signal for frequency control by prior art frequency detectors is made quite difficult, if not impossible. Accordingly, existing clock extraction circuits which do provide both a phase locked loop and frequency acquisition aid to extract the underlying clock signal have various limitations, particularly when used with NRZ input data streams.

SUMMARY OF THE INVENTION

In accordance with the present invention, a frequency detector is configured to provide reliable acquisition by a clock recovery and data regeneration circuit. In accordance with a preferred embodiment, the frequency detector utilizes the output characteristics of a phase detector to determine a frequency difference between the recovered clock signal and the incoming data signal. The frequency detector then outputs a signal representing the frequency difference to a control device, preferably to a voltage-controlled oscillator (VCO). Upon receiving the frequency difference signal, the control device, preferably operating within a controlled-feedback loop, will begin to adjust the underlying clock frequency to approximate the incoming data frequency.

Accordingly, an advantage of the present invention is that once the underlying clock frequency substantially approximates the incoming data frequency, preferably within the bandwidth of the loop filter, the phase detector may operate, such as through the use of a phase locked loop, to drive the phase error signal to essentially zero, as dictated by the bandwidth of the loop filter, and thus allow the VCO to track the phase of the incoming data signal to produce a recovered clock signal.

Another advantage of the present invention is that the frequency detector permits the use of a VCO with less stringent stability and accuracy requirements. Further, the frequency detector facilitates a significant improvement of the acquisition range of a clock recovery and data regeneration circuit, i.e., the frequency detector ensures reliable locking of a phased locked loop while also permitting a larger range of frequency response for the clock recovery and data regeneration circuit.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

FIG. 1 is a schematic representation of an exemplary clock recovery and data regeneration circuit;

FIG. 2 is a schematic representation of a frequency detector in accordance with the present invention;

FIG. 3 is a schematic representation of a preferred embodiment of a frequency detector in accordance with the present invention;

FIG. 4 is a circuit-component representation of a frequency detector in accordance with a preferred embodiment of the present invention;

FIG. 5 is a representation of an eye-diagram for evaluating the amount of signal degradation in an exemplary clock recovery and data regeneration circuit;

DETAILED DESCRIPTION OF PREFERRED EMBODIMENTS OF THE INVENTION

The present invention may be described herein in terms of functional block components and various processing steps. It should be appreciated that such functional blocks may be realized by any number of hardware components configured to perform the specified functions. For example, the present invention may employ various integrated circuit components, e.g., memory elements, digital signal processing elements, transistors, amplifiers and the like, which may carry out a variety of functions under the control of one or more microprocessors or other control devices. In addition, those skilled in the art will appreciate that the present invention may be practiced in any number of data communication contexts and that the digital communication system described herein is merely one exemplary application for the invention. Further, it should be noted that the present invention may employ any number of conventional techniques for data transmission, signal processing and conditioning, and the like. Such general techniques that may be known to those skilled in the art are not described in detail herein.

As discussed above in the connection with FIG. 1, clock extraction circuit 100 may comprise PLL 120 that is designed to drive the error signal e(t) to essentially zero, as dictated by the bandwidth of the loop filter 150, and thus allow VCO 160 to track the phase of the input signal to produce a recovered clock signal. However, as discussed above, the limited stability and accuracy of VCO 160, as well as the narrow bandwidth typically required in PLL 120, provides extraction circuit 100 with a limited lock acquisition range. Furthermore, although acquisition aids can be implemented with clock extraction circuit 100, these modified clock extraction circuits do not account for phase errors present in the input data stream. Accordingly, the prior art clock recovery and data regeneration circuits are limited in performance.

Figure 9A:
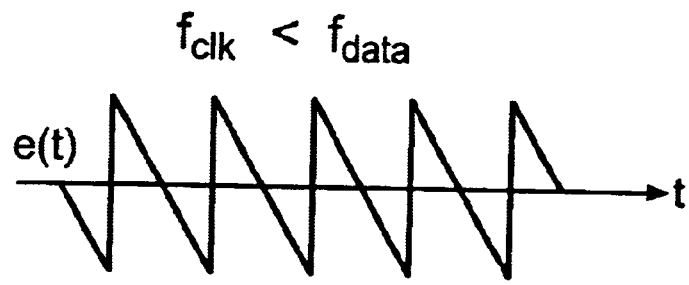
FIGS. 9A and 9B are signal representations of the output of a phase detector in accordance with a preferred embodiment of the present invention.

There are a variety of output characteristics for phase detectors. In accordance with the present invention, for example, a phase detector may provide an output that reflects a 2π ambiguity in the phase difference, i.e., the difference between the phase of the input data stream and the output of the phase detector, and which approximates a linear relationship between the output and phase of the input data stream. Accordingly, when the frequencies of the underlying clock signal and data signals are different, the output of the phase detector approximates a sawtooth waveform which repeats at a rate dependent on the frequency difference. With reference to FIG. 9A, when the frequency of the recovered clock is less than the frequency of the incoming data, the output of the phase detector, e(t), appears as a signal having a steep increasing slope and a gradual decreasing slope. Further, with reference to FIG. 9B, when the frequency of the recovered clock is greater than the frequency of the incoming data, the output of the phase detector, e(t), appears as a signal having a steep decreasing slope and a gradual increasing slope. Accordingly, it has been discovered in accordance with the present invention that by utilizing these output characteristics to determine the frequency difference between the recovered clock signal and the incoming data signal, a frequency detector may be provided which enables the clock frequency to gradually approach the data rate frequency in a manner to ensure reliable locking of a phase locked loop while also permitting a larger range of frequency acquisition for the clock recovery and data regeneration circuit.

In accordance with the present invention, a clock recovery and data regeneration circuit comprises a frequency detector and a phase detector to provide reliable locking of a phase locked loop. In accordance with a preferred embodiment, the frequency detector utilizes the output characteristics of the phase detector to determine a frequency difference between the recovered clock signal and the incoming data signal. The frequency detector then outputs a signal representing the frequency difference to a control device, preferably to a voltage-controlled oscillator (VCO). Upon receiving the frequency difference signal, the control device, preferably operating within a controlled-feedback loop, will begin to adjust the underlying clock frequency to approximate the incoming data frequency. Accordingly, once the underlying clock frequency substantially approximates the incoming data frequency, preferably within the loop bandwidth, the phase detector begins to operate within the phase locked loop as described above to drive the error signal e(t) to essentially zero, as dictated by the bandwidth of the loop filter, and thus allow the VCO to track the phase of the incoming data signal to produce a recovered clock signal. Accordingly, the frequency detector, while permitting the use of a VCO with less stringent stability and accuracy requirements, facilitates a significant improvement of the acquisition range of the clock recovery and data regeneration circuit, i.e., the frequency detector ensures reliable locking of a phase locked loop while also permitting a larger range of frequency acquisition for the clock recovery and data regeneration circuit.

Figure 9B:
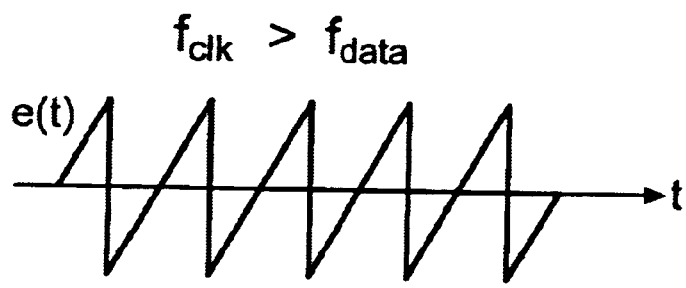

In accordance with the present invention, with reference to FIG. 2, a clock recovery and data regeneration circuit 200 suitably comprises a phase detector 205 and a frequency detector 210. Phase detector 205 preferably comprises a sawtooth phase detector, such as, for example, a Hogge phase detector, configured to provide output signals e(t) as shown in FIGS. 9A and 9B. However, phase detector 205 may also be configured as a sampling phase detector, or any other phase detector that preferably provides an output with "sawtooth" characteristics, without departing from the scope of the present invention. Indeed, the techniques of the present invention may be carried out with the use of any suitable detector configured to generate outputs having discernable characteristics related to the underlying clock and data signal frequency, phase or the like. Further, phase detector 205 may be comprised of various flip-flops, logic gates and transistors as is currently known or hereinafter devised for providing phase detector circuits.

Figure 7B:
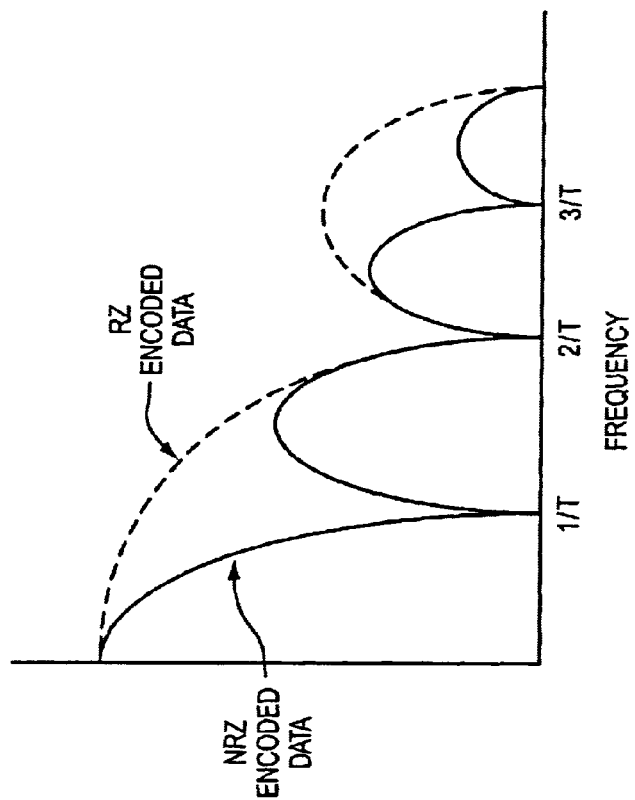
FIG. 7B is a representation of the spectra of both RZ and NRZ signals of FIG. 7A as modulated by random data.
Figure 7A:
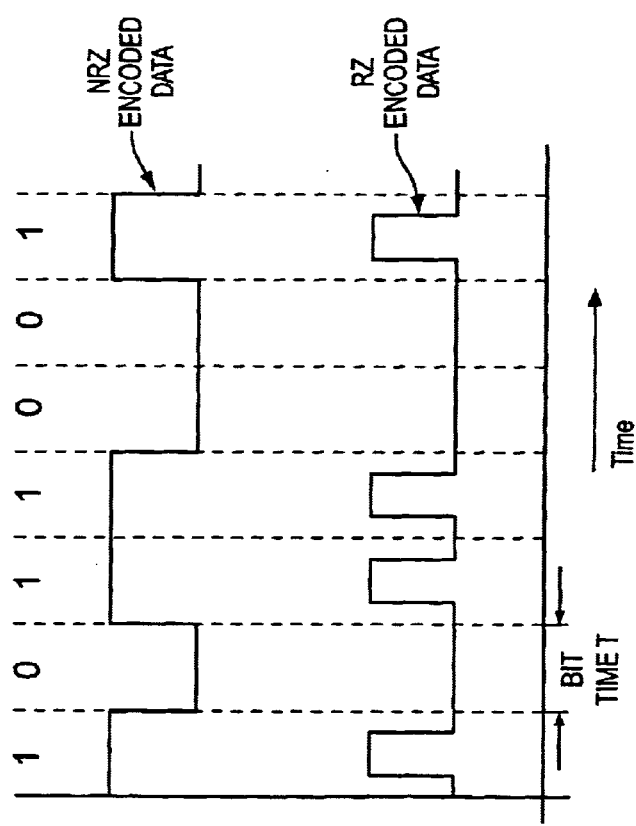
FIG. 7A is an encoded representation of non-return-to-zero (NRZ) and return-to-zero (RZ) data as may be utilized by the present invention.

Phase detector 205 preferably provides an output signal 207 which comprises reconfigured NRZ data as shown in FIG. 7A. As discussed above, the NRZ signal does not contain a component at the clock frequency, for example, at 1/T, 2/T or 3/T, where T is the bit period. Thus, no spectral density occurs at the clock frequency. However, as will be described in accordance with the present invention, frequency detector 210 is configured to facilitate frequency control with NRZ incoming data.

In accordance with one aspect of the present invention, frequency detector 210 is preferably configured to receive output signal 207 of phase detector 205 and provide an output signal 215 representing the frequency difference between the recovered clock signal and the incoming data signal. In accordance with this aspect, it has been discovered that by differentiating output signal 207 of phase detector 205, pulses representing the frequency difference may be produced. With momentary reference to FIGS. 9C and 9D, differentiated pulses are shown as a result of differentiating the output signals e(t) of a phase detector, such as, for example, phase detector 205. Accordingly, frequency detector 210 preferably comprises a differentiator to suitably differentiate output signal 207 and provide an output configured with differentiated pulses as described above. Moreover, in accordance with another aspect of the present invention, frequency detector 210 may comprise a filter component configured to filter out undesirable characteristics of the output pulses of the differentiator, such as, for example, noise components or other interferences and the like. Further, frequency detector 210 may comprise a filter component configured to filter output signal 207 prior to the differentiator, i.e., before differentiating of output signal 207.

Figure 9C:
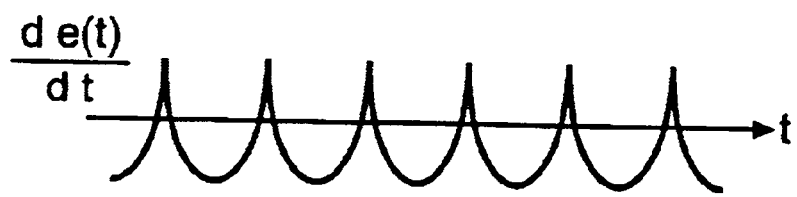
FIGS. 9C and 9D are signal representations of the output of FIGS. 9A and 9B as differentiated by a frequency detector in accordance with a preferred embodiment of the present invention.
Figure 9D:
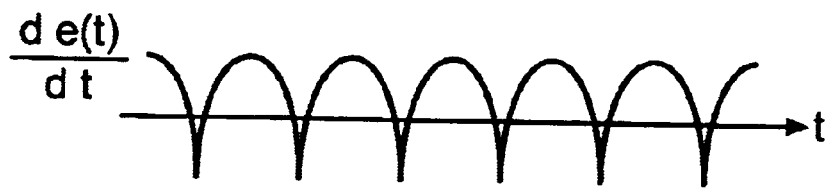

In accordance with another aspect of the present invention, frequency detector 210 preferably comprises peak detectors configured to determine the polarity of the output pulses of the differentiator, i.e., to determine whether the output pulses are positive or negative. With reference to FIGS. 9A and 9C, when the frequency of the recovered clock is less than the frequency of the incoming data, output signal 207 of phase detector 205 appears as signal having a steep increasing slope and a gradual decreasing slope while the corresponding differentiated output signal provides a series of positive pulses. Further, with reference to FIGS. 9B and 9D, when the frequency of the recovered clock is greater than the frequency of the incoming data, output signal 207 of phase detector 205 appears as signal having a steep decreasing slope and a gradual increasing slope while the corresponding differentiated output signal provides a series of negative pulses. Accordingly, the peak detectors are configured to receive the differentiated output pulses and suitably provide an output signal representative of the frequency difference. Preferably, the output signal of the peak detectors comprises a voltage signal indicative of whether the underlying clock signal frequency is less than or greater than the incoming data signal frequency. Additionally, the magnitude of the output signal of the peak detectors preferably corresponds to the amount of the frequency difference, i.e., the larger the frequency difference, the larger the magnitude of the output signal of the peak detector. Moreover, the output signal of the peak detectors may be suitably filtered before providing the frequency difference output signal 215.

In accordance with a preferred aspect of the present invention, the peak detectors of frequency detector 210 are configured to provide a threshold operation such that low amplitude noises may be substantially rejected, i.e., the peak detectors may substantially restrict an output signal by responding primarily to the differentiated output pulses and ignoring low amplitude noises. Accordingly, low amplitude noises and other minor disturbances prevailing within clock recovery and data regeneration circuit 200 may be suitably rejected by the peak detectors.

In accordance with a preferred aspect of the present invention, output signal 215 of frequency detector 210 may be coupled to an integrator 220 configured to provide a slowly varying bipolar voltage output signal proportional to the frequency difference. The slowly varying output signal enables the control device, such as a VCO, to more readily facilitate the locking of the clock recovery and data regeneration circuit.

Accordingly, by utilizing a frequency difference signal from frequency detector 210, clock recovery and data regeneration circuit 200 achieves significant improvement of the acquisition range, i.e., a larger range of frequency response for the clock recovery and data regeneration circuit, thus ensuring reliable locking of a phased locked loop.

Having described above various aspects of the present invention, a preferred exemplary embodiment of a frequency detector in accordance with the present invention will now be described. In accordance with this embodiment, with reference to FIG. 3, a frequency detector 300 suitably comprises a differentiator 310, a filter 320 and a pair of peak detectors, 330 and 340. In accordance with this embodiment, differentiator 310 preferably comprises a capacitive network suitably configured to receive an input signal 305, such as, for example, a sawtooth waveform, and provide an output signal 315. Preferably, output signal 315 comprises a pulse having an amplitude and polarity, e.g., positive or negative, dependent upon the relative frequency difference of the underlying recovered clock signal and the incoming data stream of a clock recovery and data regeneration circuit as described above (see, for example, FIGS. 9C and 9D).

In accordance with a particularly preferred embodiment, with momentary reference to FIG. 4, differentiator 310 comprises a capacitive network $C_1$ configured to differentiate input signal 305 and produce output signal 315. Preferably, capacitive network $C_1$ comprises a single capacitor, or alternatively, a series and/or parallel combination of capacitors, having an effective capacitance of between 15 pF and 25 pF.

Filter 320 is configured to receive output signal 315 and provide a filtered output signal 325. Filter 320 preferably comprises an inductive network configured to substantially eliminate noise from output signal 315 without degrading the pulse signal power of output signal 315. Accordingly, filter 320 comprises an inductor, and may comprise additional components, such as resistors and/or capacitors within the inductive network, to provide a defined impedance to the input of peak detectors 330,340. In accordance with this aspect, filter 320 preferably comprises a multipole low pass filter. Further, filter 320 may comprise a filter suitably matched to the characteristics of input signal 305, e.g., sawtooth and the like, at a predetermined frequency response, for example, 100 MHz.

In accordance with a particularly preferred embodiment, with momentary reference to FIG. 4, filter 320 comprises an inductive network L, configured to eliminate noise from output signal 315. Preferably, inductive network comprises a single inductor, or alternatively, a series and/or parallel combination of inductors, having an effective inductance of between 15nH and 30nH. To provide a filter suitably matched to the characteristics of input signal 305, filter 320 may further comprise capacitors $C_2$ and $C_3$ suitably configured with inductive network $L_1$ to provide a multipole low pass filter. In accordance with this aspect, capacitors $C_2$ and $C_3$ are suitably connected to respective ends of inductive network $L_1$ and to ground to provide the multipole low pass filter arrangement. Preferably, capacitors $C_2$ and $C_3$ each comprise a single capacitor, or alternatively, a series and/or parallel combination of capacitors, each having an effective capacitance of between 5pF and 15pF. Moreover, to provide a defined impedance to the input of peak detectors 330,340, filter 320 may comprise a resistive network $R_1$ configured to provide a fixed impedance. Preferably, resistive network $R_1$ is suitably coupled after inductive network $L_1$ but before peak detectors 330, 340. Preferably, resistive network $R_1$ comprises a single resistor, or alternatively, a series and/or parallel combination of resistors, most preferably having an effective resistance of between $20\Psi$ and $80\Omega$.

Peak detectors 330, 340 preferably comprise a positive polarity detector 330 and a negative polarity detector 340. Positive peak detector 330 is suitably configured to detect positive pulses of output signal 325 while negative peak detector 340 is suitably configured to detect negative pulses of output signal 325. Preferably peak detectors 330, 340 suitably comprise a network of diodes configured to detect the polarity of the pulses of output signal 325. Moreover, peak detectors 330, 340 may comprise a resistor/capacitor network suitably configured to reduce noise present in output signal 325 as well as provide a time constant for an output signal 360 of frequency detector 300.

Peak detectors 330, 340 are preferably configured to provide a threshold operation such that low amplitude noises may be substantially rejected, i.e., peak detectors 330, 340 restrict the providing of an output signal 360 by responding primarily to the differentiated output pulses of output signal 315 or filtered output signal 325 and ignoring low amplitude noises that may be provided by differentiator 3 10 or filter 320 or other sources. In accordance with this aspect, the network of diodes configured to detect the polarity of the pulses of output signal 325 are also suitably configured to reject low voltage signals that may be associated with noise and other disturbances. Accordingly, low amplitude noises and other minor disturbances prevailing within a clock recovery and data regeneration circuit may be suitably rejected by peak detectors 330, 340.

Accordingly, upon detecting the polarity of the pulses of output signal 325, peak detectors 330 and 340 are suitably configured to sum the pulses and provide an output signal 360. In accordance with this aspect, peak detectors 330, 340 may have outputs 335, 345 suitably coupled to provide output signal 360. Preferably, when positive pulses are being detected by positive peak detector 330, negative peak detector 340 provides voltage signals to output 345, and output 335 of positive peak detector 330 is approximately zero. On the other hand, when negative pulses are being detected by negative peak detector 340, positive peak detector 330 provides voltage signals to output 335, and output 345 of negative peak detector 340 is approximately zero.

Moreover, peak detectors 330, 340 may include a summing junction 350, such as, for example, an operational amplifier suitably configured to sum outputs 335, 345 to provide output signal 360. In accordance with this aspect, peak detectors 330, 340 provide a high output impedance to facilitate the coupling to summing junction 350.

In accordance with a particularly preferred embodiment, with momentary reference to FIG. 4, peak detector 330, i.e., the positive peak detector, suitably comprises a diode $D_2$ configured to turn on when output signal 325 provides positive pulses while peak detector 340, i.e., the negative peak detector, suitably comprises a diode $D_1$ configured to turn on when output signal 325 provides negative pulses. Preferably, diode $D_1$ and diode $D_2$ are suitably configured to turn on at a predetermined threshold level, such as, for example, 0.5–1.0 volts, such that low amplitude noises are substantially rejected by peak detectors 330, 340. Moreover, to reduce noise present in output signal 325 as well as provide a time constant for an output signal 360 of frequency detector 300, peak detector 330 preferably includes an RC network comprising a resistor network $R_3$ and a capacitor network $C_5$ while peak detector 340 preferably includes an RC network comprising a resistor network $R_2$ and a capacitor network $C_4$. Accordingly, each RC network is suitably configured such that pulses may accumulate within capacitors $C_4$ and $C_5$ to prevent the voltage from discharging at too fast a rate, e.g., to zero voltage output before the next pulse arrives. Further, each RC network is suitably configured such that capacitors $C_4$ and $C_5$ discharge at a rate faster than the slew rate of VCO 160. Preferably, each RC network comprises a single resistor and capacitor, or alternatively, a series and/or parallel combination of resistors and capacitors, most preferably each having an effective resistance of between 2k# and 4k# and an effective capacitance of 500nF to $0.2\mu F$.

Accordingly, as output signal 325 provides positive pulses, i.e., when the underlying clock frequency is less than the incoming data frequency, diode $D_2$ suitably turns on and begins to charge capacitor $C_5$; meanwhile, capacitor $C_4$ preferably begins to discharge negative voltage to an output 400. Further, as output signal 325 provides negative pulses, i.e., when the underlying clock frequency is greater than the incoming data frequency, diode $D_1$ suitably turns on and begins to charge capacitor $C_4$; meanwhile, capacitor $C_5$ preferably begins to discharge positive voltage to an output 400.

Continuing in accordance with this particularly preferred embodiment, to provide a high output impedance to facilitate the coupling to summing junction 350, such as an operational amplifier, peak detectors 330, 340 may further comprise resistive networks $R_7$ and $R_6$, respectively. Accordingly, resistive networks $R_7$ and $R_6$ each may comprises a single resistor, or alternatively, a series and/or parallel combination of resistors, most preferably each having an effective resistance, such as, for example, between $20k\Omega$ and $80k\Omega$, that is significantly less than the input impedance of an operational amplifier.

Although differentiator 310, filter 320 and peak detectors 330, 340 have been described above in a preferred arrangement of frequency detector 300, differentiator 310, filter 320 and peak detectors 330, 340 may be configured in various other manners without departing from the scope of the present invention. For example, input signal 305 may be suitably filtered by filter 320 before being differentiated by differentiator 310. Moreover, differentiator 310 may be directly coupled to peak detectors 330, 340, i.e., without filter 320 configured in between. Further, output signals 335, 345 of peak detectors 330, 340 may be suitably coupled to a filter, such as, for example, a low pass filter, to provide a filtered signal to output signal 360. Additionally, a separate threshold circuit, for example, a threshold circuit operating essentially as described above in peak detectors 330, 340, may also be implemented within frequency detector 300. Still further, frequency detector 310 may comprise a plurality of filters, such as, for example, filter 320, prior to differentiator 310, in between differentiator 310 and peak detectors 330, 340, and/or following peak detectors 330, 340 but prior to output signal 360 without departing from the scope of the present invention.

Accordingly, with continued reference to FIG. 3, a description of a preferred operation of frequency detector 300 will now be described. Phase detector 200 suitably provides an input signal 305 representative of the frequency difference between the underlying recovered clock signal and incoming data signal. Upon receiving input signal 305, differentiator 310 suitably differentiates input signal 305 to produce an output signal 315 having pulses with an amplitude and polarity representative of the frequency difference. Preferably, output signal 315 is suitably filtered by filter 320 to remove undesirable noise and other impairments to produce a filtered output signal 325. Accordingly, peak detectors 330, 340 may suitably determine the polarity of the pulses of output signal 325 before providing an output signal 360 of frequency detector 300. Upon providing output signal 360, frequency detector 300 may be suitably coupled to integrator 220 to provide a slowly varying bipolar voltage proportional to the frequency difference. Accordingly, the voltage signal can be provided to the control device, such as the VCO, to allow clock recovery and data regeneration circuit 200 to achieve significant improvement of the acquisition range.

Figure 6:
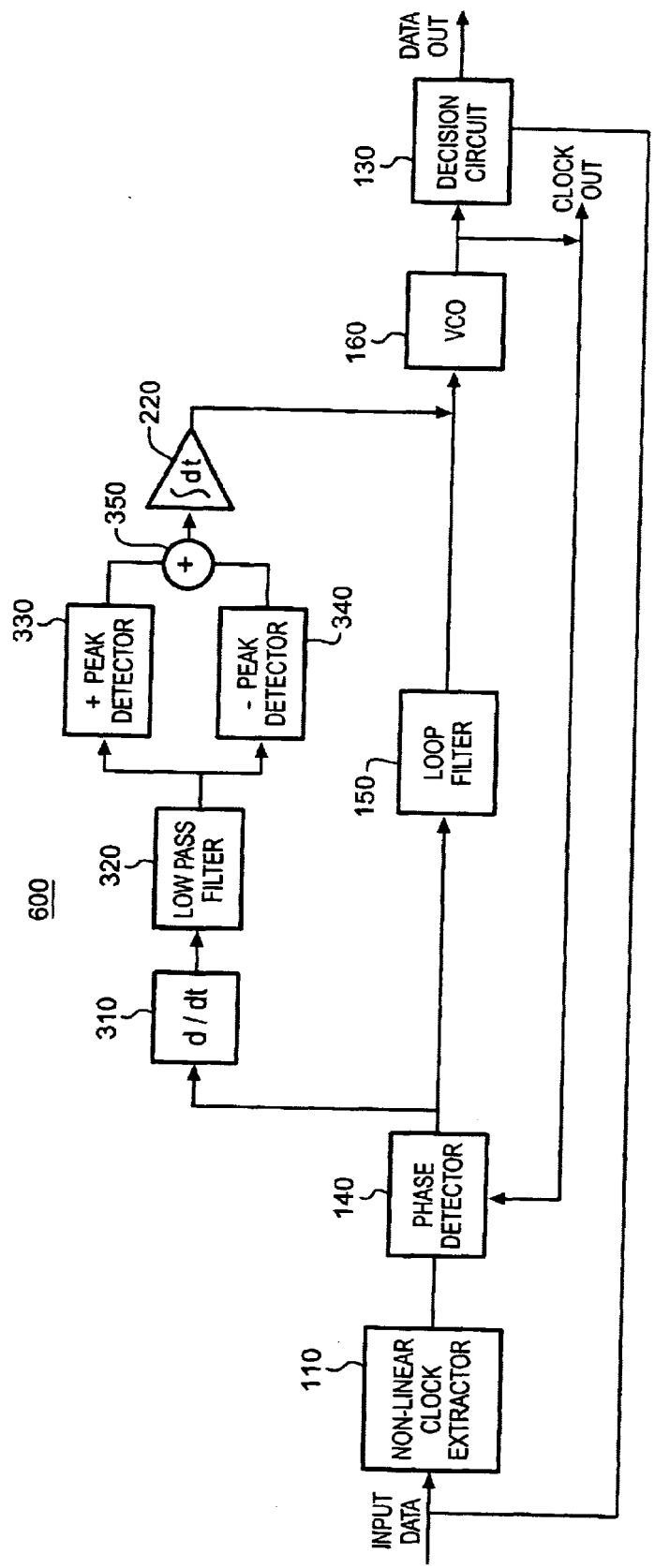
FIG. 6 is a schematic representation of an exemplary clock recovery and data regeneration circuit incorporating a preferred embodiment of a frequency detector in accordance with the present invention.

Having described a preferred exemplary embodiment of a frequency detector in accordance with the present invention, with reference to FIG. 6, an exemplary clock recovery and data regeneration circuit incorporating a preferred embodiment of the frequency detector will now be described. In accordance with this embodiment, a clock recovery and data regeneration circuit 600 preferably comprises non-linear clock extractor 110 and decision circuit 130, with a first loop for phase alignment, comprising a PLL having phase detector 140, loop filter 150 and VCO 160, and with a second loop for frequency alignment (frequency detector loop), comprising differentiator 310, low pass filter 320, peak detectors 330, 340, summing junction 350, and integrator 220.

As incoming data signals arrive into clock recovery and data regeneration circuit 600, clock extractor 110 begins to recover the underlying clock signal. As the underlying clock signal is received within phase detector 140, an output signal of phase detector 140 is suitably received within differentiator 310 and loop filter 150. As such, differentiator 310, low pass filter 320, peak detectors 330, 340 and integrator 220 will suitably provide an slowly varying frequency difference output signal to suitably drive VCO 160 and thus provide an underlying clock signal substantially approximating the incoming data frequency, e.g., within a loop bandwidth of the incoming data frequency. Once the underlying clock signal substantially approximates the incoming data frequency, the frequency detector loop will preferably shut off, i.e., become inactive, and allow the phased locked loop to begin operating. As such, phase detector 140 and loop filter 150 will begin to operate to allow VCO 160 to track the phase of the input signal to produce a recovered clock signal.

Alternatively, the frequency detector loop may suitably operate to drive the frequency difference to a smaller value, and then allow the phase locked loop to suitably operate before the frequency difference is reduced to substantially zero. After the phase locked loop begins to suitably track the phase error between the underlying clock signal and the incoming data stream, clock recovery and data regeneration circuit 600 may return to the use of the frequency detector loop to further reduce the frequency difference. Still further, the phase locked loop and frequency detector loop may be suitably alternated, or used substantially concurrently, to allow clock recovery and data regeneration circuit 600 to align and track the frequency and phase of the incoming data stream.

Accordingly, the frequency detector loop permits the use of VCO 160 with less stringent stability and accuracy requirements, and thus facilitates a significant improvement of the acquisition range of clock recovery and data regeneration circuit 600. Stated another way, the second order loop having the frequency detector ensures reliable locking of the first order loop, i.e., the phased locked loop, while also permitting a larger range of frequency response for clock recovery and data regeneration circuit 600.

Figure 8:
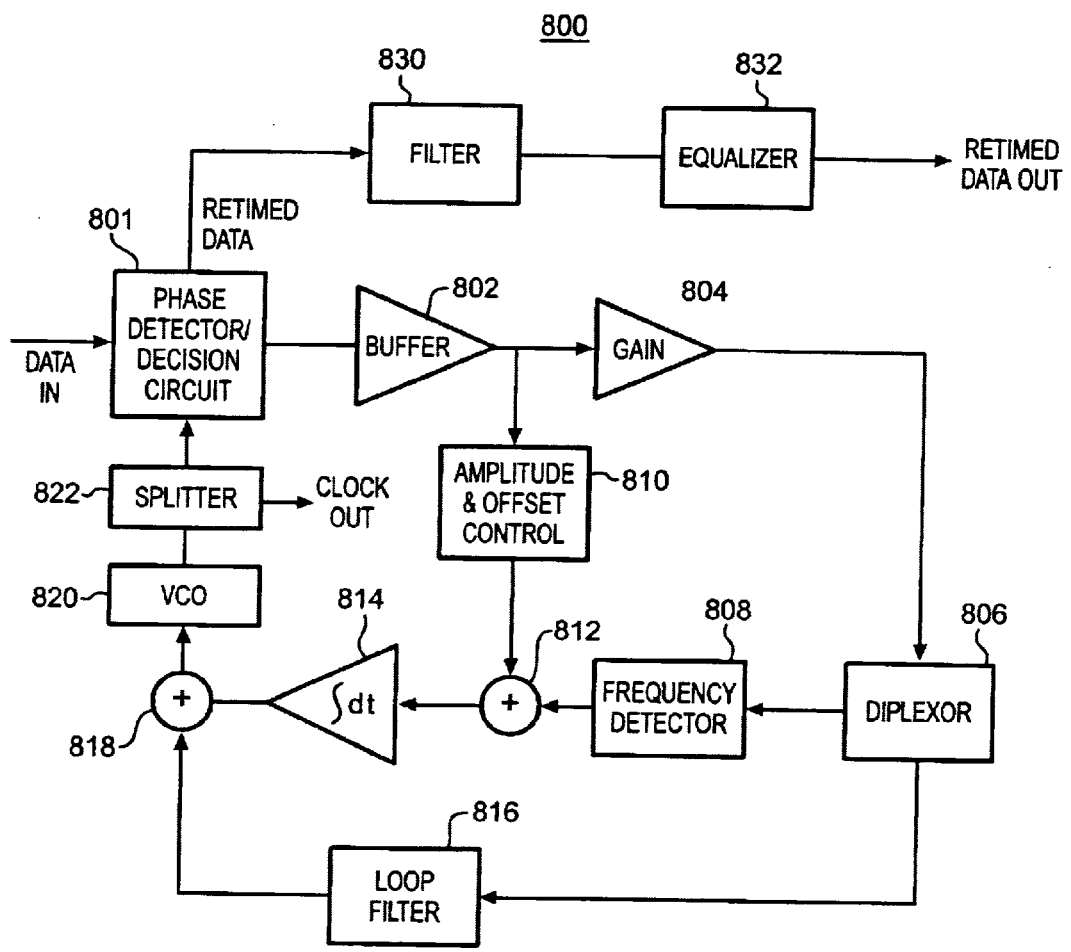
FIG. 8 is a schematic representation of a preferred embodiment of a clock recovery and data regeneration circuit in accordance with the present invention.

Having described an exemplary clock recovery and data regeneration circuit incorporating a preferred embodiment of the frequency detector, with reference to FIG. 8, another preferred exemplary clock recovery and data regeneration circuit 800 will now be described. Clock recovery and data regeneration circuit 800 includes a first order loop comprising a phase detector 801, a buffer 802, a gain amplifier 804, a loop filter 816 and a VCO 820. Preferably, the phase error output of phase detector 801 is coupled to buffer 802, such as, for example, an emitter follower, to buffer the output of phase detector 801 and to amplifier 804, such as, for example, a wide band amplifier prior to loop filter 816. Moreover, clock recovery and data regeneration circuit 800 includes a diplexor 806 configured to separate high and low frequency portions of the output of phase detector 801. Preferably, the low frequency portions of the output of phase detector 801 are attenuated and applied to loop filter 816 and thus VCO 820 to complete the first order PLL.

Clock recovery and data regeneration circuit 800 may also include an amplitude and offset control device 810 preferably configured in a parallel path with the first order PLL. Preferably, device 810 is configured to adjust the offset of the output of phase detector 801, such as by the use of a potentiometer, and applied to a summing amplifier 812. Further, the adjusted output may be integrated by an integrator 814 before being applied to another summing amplifier 818 and then VCO 820. Accordingly, a second order PLL may be provided to further facilitating the tracking of the phase error of the underlying clock signal by the VCO. Moreover, the second order PLL may facilitate a simple adjustment of the relative phase of the underlying clock signal at the decision point, such as by the use of a remotely controlled potentiometer within device 810.

The high frequency portions of the output of phase detector 801, as determined by diplexor 806, are preferably applied to a frequency detector 808. Further, the output of the frequency detector 808 may be integrated by integrator 814 before being applied to summing amplifier 818 and VCO 820. Accordingly, a first order loop, particularly for high frequency portions of the output of phase detector 801, may be realized for frequency acquisition of clock recovery and data regeneration circuit 800, thus significantly improving the acquisition range as well as relaxing the requirements on the accuracy and temperature coefficient of VCO 820.

Clock recovery and data regeneration circuit 800 may also include a splitter 822 for providing the recovered clock output signal. Preferably, splitter 822 provides a 10:1 power ratio and comprises a 4-port directional coupler. Moreover, clock recovery and data regeneration circuit 800 may also include a filter 830 and an equalizer 832 for providing the reconfigured output data stream, i.e., the retimed data, from a decision circuit 801. Preferably, filter 830 comprises a high impedance, resonant filter configured to substantially remove clock feedthrough and other like distortions. Further, equalizer 832 preferably comprises a parallel combination of a resistor and capacitor network in series with the output signal of decision circuit 801.

In summary, the frequency detector of the present invention, while permitting the use of a VCO with less stringent stability and accuracy requirements, facilitates a significant improvement of the acquisition range of the clock recovery and data regeneration circuit, i.e., the frequency detector ensures reliable locking of a phased locked loop while also permitting a larger range of frequency acquisition for the clock recovery and data regeneration circuit.

The present invention has been described above with reference to a preferred embodiment. However, those skilled in the art will recognize that changes and modifications may be made to the preferred embodiment without departing from the scope of the present invention. For example, the frequency detector and phase detector, or more particularly, the differentiator, filters, or peak detectors may be implemented in alternate ways depending upon the particular application or in consideration of any number of other functions associated with the operation of the system. In addition, the various component values for the resistors, inductors, capacitors and diodes for the frequency detector described above are exemplary and may be selected according to any number of design factors associated with a particular phase detector. Further, the techniques described herein may be extended or modified for use with other digital components in a data communication system. These and other changes or modifications are intended to be included within the scope of the present invention, as expressed in the following claims.

What is claimed is:

1. A clock recovery circuit having a phase locked loop for recovering an underlying clock signal from an input data stream, said clock recovery circuit comprising:
   a phase detector for providing an output signal having characteristics representative of the frequency difference between the frequency of the underlying clock signal and the frequency of the input data stream;
   a frequency detector, said frequency detector comprising a differentiator, a positive peak detector and a negative peak detector, said frequency detector responsive to said output signal of said phase detector, for providing an output signal corresponding to a magnitude of the frequency difference; and
   an integrator, responsive to said output signal of said frequency detector, for providing a slowly varying bipolar voltage output signal proportional to the frequency difference.

2. The clock recovery circuit of claim 1, wherein said differentiator is responsive to said output signal of said phase detector, is for providing a differentiated output signal representative of the frequency difference, and
   wherein said positive peak detector and said negative peak detector are coupled in parallel and determine the polarity of the differentiated output signal to indicate whether the frequency of the underlying clock signal is greater than or less than the frequency of the incoming data signal.

3. The clock recovery circuit of claim 2, wherein said phase locked loop comprises said phase detector, a loop filter and an oscillator control device, said integrator is coupled to said oscillator control device, and said slowly varying bipolar voltage output signal enables said oscillator control device to facilitate locking of the phase locked loop over an acquisition range exceeding the bandwidth of said loop filter in the phase locked loop.

4. The clock recovery circuit of claim 2, wherein said positive peak detector and said negative peak detector provide said corresponding output signal of the frequency detector to said integrator only if said differentiated output signal exceeds a threshold level.

5. The clock recovery circuit of claim 4, wherein said positive peak detector and said negative peak detector substantially reject low amplitude noise.

6. The clock recovery circuit of claim 2, wherein said frequency detector further comprises an inductive filter configured between said differentiator and said positive peak detector and said negative peak detector.

7. The clock recovery circuit of claim 6, wherein said inductive filter comprises a multipole filter.

8. The clock recovery circuit of claim 3, wherein said differentiator, said positive peak detector and said negative peak detector, and said integrator comprise a frequency detector loop for frequency alignment;
   such that said frequency detector loop provides said slowly varying bipolar voltage output signal to said oscillator control device to enable said oscillator control device to control the clock recovery circuit to provide a recovered clock signal within at least the loop filter bandwidth of the frequency of the input data stream.

9. The clock recovery circuit of claim 8, wherein said phase locked loop operates to track the phase of the input data stream after said frequency detector loop has substantially enabled said oscillator control device to provide the recovered clock signal within at least the loop filter bandwidth of the frequency of the input data stream.

10. The clock recovery circuit of claim 9, wherein said positive peak detector and said negative peak detector provide said corresponding output signal of said frequency detector to said integrator only if said differentiated output signal exceeds a threshold level.

11. The clock recovery circuit of claim 10, wherein said positive peak detector and said negative peak detector substantially reject low amplitude noises.

12. The clock recovery circuit of claim 9, wherein said frequency detector loop further comprises an inductive filter configured between said differentiator and said positive peak detector and said negative peak detector.

13. The clock recovery circuit of claim 12, wherein said inductive filter comprises a multipole filter.

14. A frequency detector for providing a frequency difference signal for use with a clock extraction and data regeneration circuit, said frequency detector comprising:
   a differentiator, responsive to an input signal representative of the frequency difference between the frequency of an underlying clock signal and the frequency of an incoming data signal, for providing a corresponding differentiated output signal; and
   a pair of peak detectors responsive to the differentiated output signal, for providing an output voltage signal representative of said frequency difference to facilitate the frequency acquisition through a control device of the clock extraction and data regeneration circuit, wherein said pair of peak detectors comprises a positive peak detector and a negative peak detector for determining the polarity of pulses of said differentiated output signal.

15. The frequency detector of claim 14, wherein positive pulses in said differentiated output signal detected by the positive peak detector indicate to said control device that the frequency of the underlying clock signal is greater than the frequency of the incoming data signal, and negative pulses in said differentiated output signal detected by the negative peak detector indicate to said control device that the frequency of the underlying clock signal is less than the frequency of the incoming data signal.

16. The frequency detector of claim 15, wherein the magnitude of the output voltage signal of the pair of peak detectors indicates the amount of frequency difference.

17. The frequency detector of claim 14, wherein said output voltage signal representative of the frequency difference is provided only if the differentiated output signal exceeds a threshold level.

18. The frequency detector of claim 14, wherein said frequency detector further comprises an inductive filter.

19. The frequency detector of claim 18, wherein said inductive filter is configured between said differentiator and said pair of peak detectors.

20. The frequency detector of claim 19, wherein said inductive filter comprises a multipole filter.

21. The frequency detector of claim 15, further comprising a summing amplifier, responsive to said output voltage signal from said positive peak detector and said negative peak detector.

22. A clock extraction and data regeneration circuit for recovering an underlying clock signal from an incoming data signal, said clock extraction and data regeneration circuit comprising:
   a first order phase locked loop comprising:
      a phase detector for determining phase of the incoming data signal, and for providing an output signal having characteristics corresponding to the frequency difference between the frequency of said underlying clock signal and the frequency of said incoming data signal;

a loop filter having a defined bandwidth; and a voltage-controlled oscillator for tracking the phase of the incoming data signal; and a first order frequency detector loop comprising:

a differentiator, responsive to said output signal of said phase detector, for providing a differentiated output signal indicative of the frequency difference of the underlying clock signal and the incoming data signal;

a pair of peak detectors for determining the polarity of said output signal of said differentiator; and an integrator, responsive to an output signal from said pair of peak detectors, for providing a slowly varying bipolar voltage to the voltage controlled oscillator; wherein: said first order frequency detector loop facilitates through said voltage-controlled oscillator locking of the first order phase locked loop over a frequency acquisition range exceeding the defined bandwidth of the loop filter.

23. The clock extraction and data regeneration circuit of claim 22, wherein said first order frequency detector loop provides said slowly varying bipolar voltage output signal to said voltage controlled oscillator to enable said voltage controlled oscillator to control the clock extraction and data regeneration circuit to provide a recovered clock signal with a frequency within at least the loop filter bandwidth of the frequency of the incoming data signal.

24. The clock extraction and data regeneration circuit of claim 23, wherein said first order phase locked loop tracks the phase of said incoming data signal after said first order frequency detector loop has substantially enabled said voltage controlled oscillator to provide said recovered clock signal.

25. The clock extraction and data regeneration circuit of claim 24, further comprising a second order phase locked loop for tracking of phase error of said underlying clock signal by said voltage-controlled oscillator, said second order phase locked loop configured in parallel with said first order phase locked loop, and said second order phase locked loop comprising an amplitude and offset control device for adjusting the offset of the output signal of said phase detector.

26. The clock extraction and data regeneration circuit of claim 23, wherein said pair of peak detectors comprises a positive peak detector and a negative peak detector for determining the polarity of pulses of said differentiated output signal.

27. A frequency detector for generating an output voltage representing the difference in frequency between a clock signal and an input signal, said frequency detector comprising:

a differentiator, responsive to said input signal, for generating an output signal corresponding to said difference in frequency: and a pair of peak detectors, coupled in parallel, for generating said output voltage in response to said output signal of said differentiator wherein said pair of peak detectors comprises a positive peak detector and a negative peak detector for determining the polarity of pulses of said differentiated output signal.

28. The frequency detector of claim 27, wherein positive pulses in said differentiated output signal detected by said positive peak detector indicate that the frequency of said clock signal is greater than the frequency of said input signal, and negative pulses in said differentiated output signal detected by said negative peak detector indicate that the frequency of said clock signal is less than the frequency of said input signal.

29. The frequency detector of claim 28, wherein the magnitude of said output voltage signal of the pair of peak detectors corresponds to the amount of frequency difference between said clock signal and said input signal.

30. The frequency detector of claim 27, wherein said output voltage signal representative of the frequency difference is provided only if the differentiated output signal exceeds a threshold level.

31. The frequency detector of claim 30, wherein said frequency detector further comprises an inductive filter configured between said differentiator and said pair of peak detectors.

32. The frequency detector of claim 31, wherein said inductive filter comprises a multipole filter.

33. The frequency detector of claim 31, wherein said frequency detector further comprises an deductive filter configured prior to said differentiator for filtering an output signal phase detector, said inductive filter providing a filtered output signal to said differentiator.

* * * * *